United States Patent [19]

Broers et al.

[11] Patent Number: 4,557,995
[45] Date of Patent: Dec. 10, 1985

[54] METHOD OF MAKING SUBMICRON CIRCUIT STRUCTURES

[75] Inventors: Alec N. Broers, Purdys; Robert B. Laibowitz, Peekskill, both of N.Y.

[73] Assignee: International Business Machines Corporation, Armonk, N.Y.

[21] Appl. No.: 311,831

[22] Filed: Oct. 16, 1981

[51] Int. Cl.⁴ .............................................. G03C 5/00
[52] U.S. Cl. .................................... 430/296; 430/312; 430/313; 430/316; 430/394; 430/502; 427/96; 427/43.1
[58] Field of Search ............... 430/313, 312, 316, 502, 430/394, 296

[56] References Cited

U.S. PATENT DOCUMENTS

| | | | |
|---|---|---|---|
| 3,264,105 | 8/1966 | Houtz | 430/312 |
| 3,313,626 | 4/1967 | Whitney | 430/302 |
| 3,798,036 | 3/1974 | Schnepf | 430/394 |
| 3,964,908 | 6/1976 | Bargon et al. | 430/296 |

Primary Examiner—Jack P. Brammer
Attorney, Agent, or Firm—Ronald L. Drumheller

[57] ABSTRACT

Double sided lithography is disclosed for fabricating ultra-small multilayer microcircuit structures without need for any intermediate realignment and without need for any intermediate layer deposition involving re-establishment of surface planarity. Microcircuit patterns are defined on opposite sides of a thin substrate by an exposure tool without intermediate removal of the substrate from the exposure tool, the microcircuit pattern on one side being defined by incident patterning radiation and the microcircuit pattern on the other side being defined by patterning radiation which has passed through the thin substrate.

29 Claims, 14 Drawing Figures

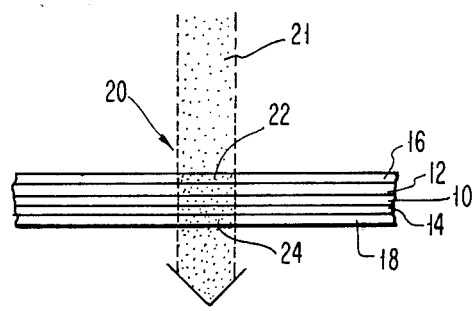
FIG. 1.1
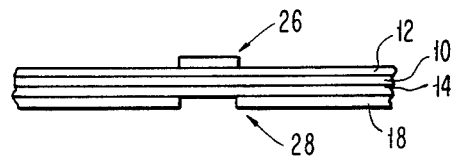
FIG. 1.2
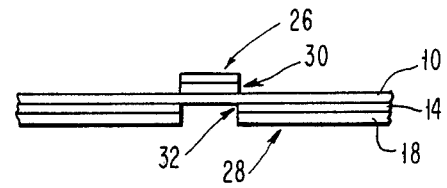
FIG. 1.3
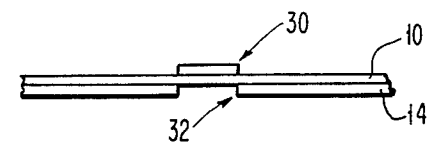
FIG. 1.4
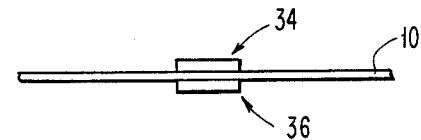
FIG. 2

FIG. 5.1
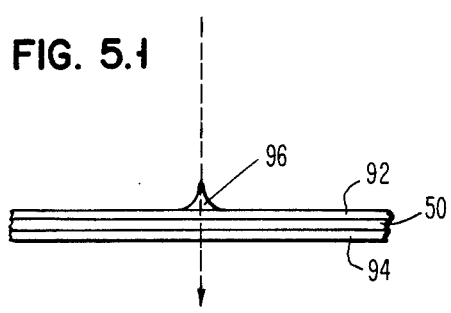
FIG. 5.2
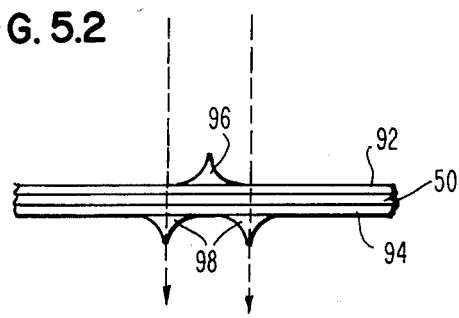
FIG. 5.3
FIG. 5.4
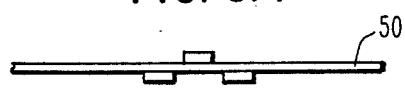
FIG. 6.1
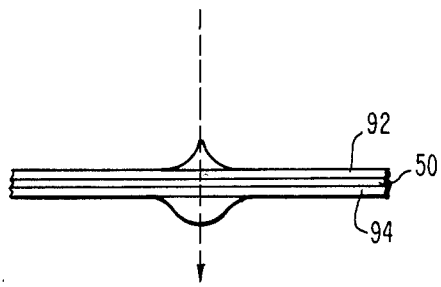
FIG. 6.2

FIG. 7

```
┌─────────────────────────────────────────┐
│ DEFINE A FIRST MICROCIRCUIT PATTERN     │
│ ON ONE SIDE OF A THIN FILM SUBSTRATE    │
│ WITH RADIATION INCIDENT UPON THAT SIDE  │
└─────────────────────────────────────────┘
                    │
                    ▼
┌─────────────────────────────────────────┐
│ DEFINE A SECOND MICROCIRCUIT PATTERN    │
│ ON THE OPPOSITE SIDE WITH RADIATION THAT│
│ HAS PASSED THROUGH THE SUBSTRATE,       │
│ WHEREBY INTERMEDIATE REALIGNMENT OF     │
│ THE SUBSTRATE IS AVOIDED                │
└─────────────────────────────────────────┘
```

METHOD OF MAKING SUBMICRON CIRCUIT STRUCTURES

DESCRIPTION

1. Technical Field This invention relates to electronic circuit structures of submicron size and to methods of forming such structures.

2. Background Art

It has become advantageous to reduce the physical size of electronic devices, components and circuits as much as possible since it has been found that a reduction in size typically results in a reduction in cost as well as an increase in performance. Microminiature electronic devices are fabricated and largely interconnected using lithographic techniques. In successive steps, thin patterned layers of desired material are formed on top of each other to build up a desired multilayer integrated electronic structure. Each component layer of an integrated electronic circuit typically is patterned differently. A resist layer is used to pattern a component layer. The resist layer itself is patterned first by exposing it to a desired pattern of actinic radiation and then developing (preferentially etching away) either the exposed regions (positive resist) or the unexposed regions (negative resist). In one method of forming a patterned component layer (called lift-off), the patterned resist layer acts as a mask during deposition of the component layer. In another method, the patterned resist layer acts as an etching mask to pattern a previously deposited underlying component layer. In either method the patterned resist layer normally must be removed before the next component layer is formed on top using another resist layer.

Characteristic of this process is the need to realign each exposure pattern with previously formed component layer patterns. Realignment of the multilayer structure is needed before patternwise exposure of each individual resist layer (except possibly the first one) because there are process steps between successive pattern exposures which require removal of the multilayer structure from the exposure tool (e.g. resist layer development, resist removal, resist deposition, component layer etching, etc.). Realignment is typically done by aligning each exposure pattern with respect to alignment marks on the multilayer structure. The accuracy of these realignments is particularly critical when active devices are being formed by several successive component layers. Even small misalignments can affect device characteristics. This problem becomes even more severe as the physical size of the active devices is reduced.

Another problem in fabricating very small multilayer devices arises as a result of conflicting requirements as to the layer thicknesses. A patterned component layer is a pattern of regions where the layer material is absent. The surface thus is very uneven. The next layer to be deposited (either an unpatterned component layer or a resist layer) should result again in a substantially flat surface. This tends to happen better when the next layer is relatively thick. On the other hand, pattern resolution in the next layer is typically reduced as the thickness of the layer is increased. Thus, resolution considerations suggest a thinner layer while the desirability for a flat surface suggests a thicker layer.

Surface topography requirements together with alignment requirements has effectively limited the degree to which multilayer device structures can be reduced in size. While isolated line structures have been fabricated with a linewidth as small as 80Å (A.N. Broers et al, "29 Appl. Phys. Lett. 596 (1976)) and dense single layer patterns (equal linewidths and spaces) have been fabricated with linewidths as small as 150Å (A.N. Broers et al., "250Å linewidths with PMMA electron resist" 33 Appl. Phys. Lett. 392 (1978)), operational multilayer devices have been produced only with a minimum linewidth of about 1500Å. This difference is largely due to the above described additional problems which are encountered when multilayer device structures are fabricated one layer at a time using conventional lithography methods. Techniques which have served well to improve resolution in single layer structures, such as the use of ultrathin substrates and the use of contamination resist cannot be extended easily for use in a conventional multilayer lithography process. Ultrathin substrates are very fragile, so that a yield problem can be expected to occur with any multilayer process using ultrathin (membrane) substrates. Removal of contamination resist (a necessary process step if such resist is to be used in a conventional multilayer process) has not been developed yet as a practical process step.

A breakthrough will occur in device fabrication when multilayer device structures can be fabricated with the same linewidth as has been achieved with single layer lithography, namely 80Å to 150Å or less, because in this range the dimensions of the device will be approaching the size of individual material grains as well as the distances involved in physical processes such as quantum mechanical tunnelling and electron scattering. Hence, entirely new devices then will become available to the art.

DISCLOURE OF INVENTION

Double sided lithography is disclosed for fabricating ultra-small multilayer microcircuit structures without need for any intermediate realignment and without need for any intermediate layer deposition involving reestablishment of surface planarity. Microcircuit patterns are defined on opposite sides of a thin substrate by an exposure tool without intermediate removal of the substrate from the exposure tool, the microcircuit pattern on one side being defined by incident patterning radiation and the microcircuit pattern on the other side being defined by patterning radiation which has passed through the thin substrate.

In one embodiment the same radiation pattern defines microcircuit patterns on both sides of the thin substrate simultaneously. In another embodiment different radiation patterns are used to define the respective microcircuit patterns on each side. In this latter embodiment the two sides of the thin substrate may not be simultaneously sensitive to the same radiation pattern. This is done either by making the character of the two radiation patterns different or by sensitizing only one side of the substrate at a time to patterning radiation. The preferred patterning radiation is electron beam radiation and the preferred method of defining the microcircuit patterns is with contamination resist. Controlled deposition of contamination resist by electron beam onto only one side of a thin substrate at a time is done by supplying contamination material to only one side of the substrate at a time.

BRIEF DESCRIPTION OF THE DRAWINGS

FIGS. 1.1–1.4 are a step-by-step illustration of double sided lithography in accordance with this invention using one radiation pattern and two resist layers, one resist layer being a positive resist and the other resist layer being a negative resist.

FIG. 2 illustrates the different result achieved when both resist layers are negative acting.

FIGS. 5.1–5.4 are a step-by-step illustration of double sided lithography in accordance with this invention employing two different electron beam patterns and forming two different contamination resist patterns.

FIGS. 6.1–6.2 illustrate another type of double sided lithography using contamination resist.

FIG. 7 is a block diagram of the general method in accordance with this invention.

BEST MODES FOR CARRYING OUT THE INVENTION

Figure 3:
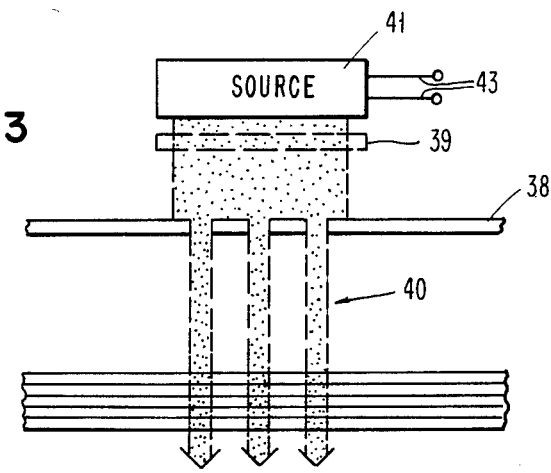
FIG. 3 illustrates the use of a mask to form a pattern of exposing radiation.

We have discovered that ultra-small multilayer microcircuit structures may be fabricated having self-aligned patterned layers by taking advantage of the ability of patterning radiation to pass completely through thin material layers in order to define a lithographic pattern on the opposite side of a thin supporting membrane or substrate. Preferably the supporting membrane or substrate becomes the central layer of an active device formed by lithographically patterning layers situated on opposite sides of the supporting membrane or substrate.

Thin supporting membranes or "window" substrates which may be used in practicing this invention are described, for example, in U.S. Pat. No. 3,971,860, in A. N. Broers et al., "High Resolution Electron Beam Fabrication Using STEM", Proc. Ninth Int. Cong. on Electron Microscopy, Toronto, Vol. 3, pp. 343–354 (1978) and in A. N. Broers et al., "High Resolution Electron Beam Lithography and Applications to Superconducting Devices", 44 Amer. Inst. Phys. Proc. 289 (1978), all of which are hereby incorporated by reference. A window substrate is formed, for example, by coating a silicon wafer with a thin film and then preferentially etching the silicon away to leave a window covered with a thin film membrane. Preferred membranes consist of silicon nitride or oxide of 200 to 2000Å thickness.

Referring now to FIG. 1.1, a supporting membrane or substrate 10 is coated on the top side with a layer 12 and on the bottom side with a layer 14. As will become more apparent, the materials of layers 10, 12, 14 (and the thicknesses to a great extent) are selected in accordance with the materials and thicknesses desired in a final device structure. On top of layer 12 a resist layer 16 is deposited and on top of layer 14 (physically below it) a second resist layer 18 is deposited. This whole structure is then irradiated with a desired pattern of actinic radiation 20 (here represented by a single beam 21). As will be apparent to anyone of ordinary skill in this art, the pattern of radiation may be created through use of a mask (projection, contact or proximity type) or by writing with a fine beam (raster scan or vector scan). In general, the radiation may be any type of particle beam, such as an electron beam or ion beam, or any type of electromagnetic radiation, such as visible light, ultraviolet light, or x-ray radiation. The radiation pattern 20 passes completely through the multilayer structure exposing a corresponding pattern 22 in resist layer 16 and a corresponding pattern 24 in resist layer 18. It should be appreciated that some scattering and focussing differences can be expected between resist layers 16 and 18 in practice, so that the exposed patterns 22, 24 should not be expected to be exactly identical in a practical multilayer structure of this type. For the purpose of illustration, however, patterns 22, 24 are shown to be virtually identical.

For the purpose of this illustration it is assumed that resist layers 16, 18 are both sensitive to at least one radiation component of the radiation pattern, but that resist layer 16 is negative acting and that resist layer 18 is positive acting. After development of resist layers 16, 18 (not necessarily in the same developer solution or necessarily at the same time), the structure illustrated in FIG. 1.2 results. Resist layer 16 has been removed everywhere except in the subareas 22 which have been irradiated to form a first resist pattern 26, while resist layer 18 has been removed only in the subareas which have been irradiated to form a second pattern 28 which is substantially complementary to resist pattern 26.

This structure next is subjected to an etchant which removes layers 12 and 14 everywhere not protected by an overlying resist layer. It is not necessary that both sides be etched simultaneously nor that both sides be etched in the same manner. A preferred method of etching is through use of an ion beam. As a result of etching both sides, the structure illustrated in FIG. 1.3 results. A first microcircuit pattern 30 has been formed corresponding to resist pattern 26 and a second microcircuit pattern 32 has been formed corresponding to resist pattern 28. Microcircuit patterns 30, 32 are substantially complementary. The resist layers now may be completely removed with a suitable solvent to produce the device structure illustrated in FIG. 1.4. It should be noted that two microcircuit patterns 30, 32 which are substantially complementary have been formed in opposite sides of an intermediate layer 10. This is the geometrical configuration for certain microcircuit devices such as field effect transistors. Both microcircuit patterns have been defined by the same radiation source (in fact the same radiation pattern) and without any need for intermediate realignment. In theory, further microcircuit layers could be added to one or both sides in subsequent steps if desired. In practice, the thin membrane substrates currently available in the art are rather fragile so that further two sided lithography may not be practical until less fragile membrane substrates are developed. If no further lithography is required, the resist layers obviously need not be removed.

FIG. 2 illustrates the end structure which results instead when resist layers 16 and 18 are both negative acting. The microcircuit patterns 34, 36 in this case are substantially identical and automatically self aligned with each other. Certain microcircuit device structures also have this geometrical configuration, such as tunnel junction devices.

FIG. 3 illustrates the use of a mask 38 to produce a radiation pattern 40 incident upon and passing through the multilayer structure first illustrated in FIG. 1.1. Mask 38 may be in contact with the multilayer structure, or it may be close to it but not touching (proximity mask), or it may be far away from the multilayer structure (projection mask). When the mask and multilayer structure are spaced far apart, one or more lens elements might be interposed between the mask and multilayer structure for the purpose of imaging the mask onto the multilayer structure. As illustrated in FIG. 3, a filter 39 may be interposed between the thin film multilayer structure 38 and the radiation source 41 to alter an energy characteristic of the radiation emitted from the source. This may be used, for example, in order to selectively prevent the resulting radiation from affecting one of the resist layers while the other resist layer is being patterned. Alternatively, it is possible to directly control an energy characteristic of source 41 via control leads 43. These leads may control, for example, the temperature of an electromagnetic energy radiating body (and consequently the emission spectrum) or an acceleration voltage in the case of a charged particle beam.

Figure 4:
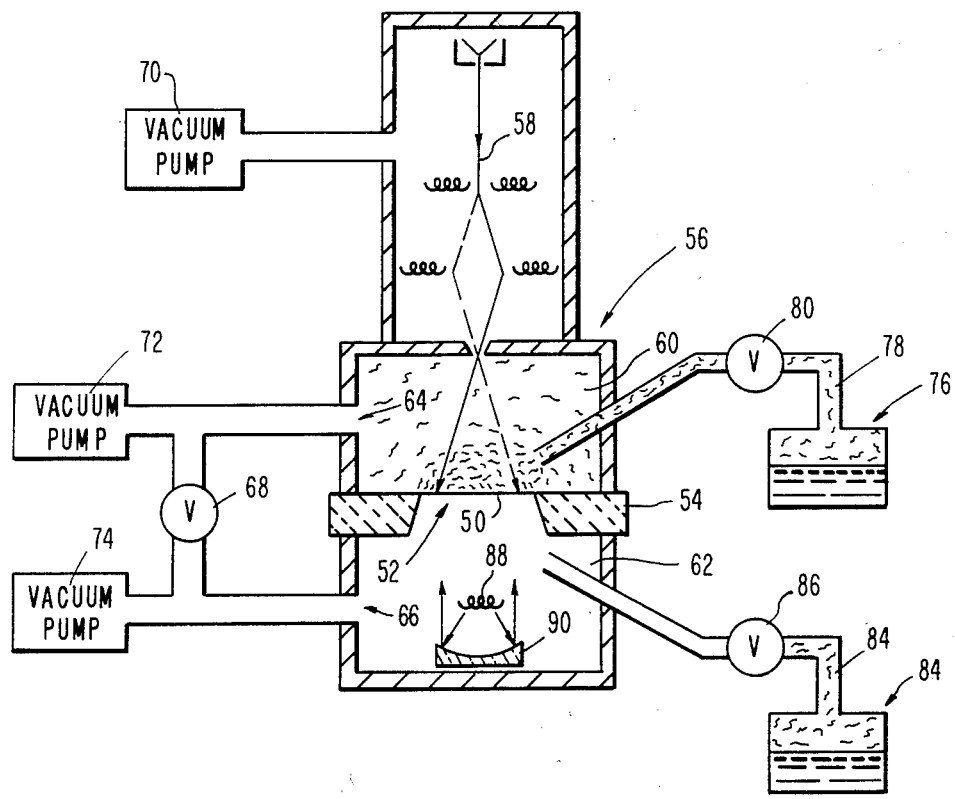
FIG. 4 schematically show apparatus for carrying out contamination resist double sided lithography.

FIG. 4 schematically illustrates apparatus for double sided lithography with contamination resist. A thin membrane 50 covers an etched window 52 in a silicon support 54. Fabrication of such a structure is described, for example, in the previously cited references. This "window" substrate is mounted within an electron beam chamber 56 in a position such that the electron beam 58 can strike the membrane. The chamber space 60 above the membrane is separated from the chamber space 62 below the membrane in any convenient manner. In the illustration, the top and bottom parts are separated by the window substrate itself. It should be understood that in practice window substrates are much smaller than illustrated so that separate partitioning means would be used instead.

Since the top chamber space 60 and the bottom chamber space 62 are not connected within the chamber 56, separate pump out ports 64, 66 communicate with the chamber spaces 60, 62. During evacuation of the chamber, the pressure in spaces 60, 62 must be equal to avoid damage to the membrane 50. A valve 68 is opened during evacuation to equalize pressure in the chamber spaces. Vacuum pumps 70, 72, 74 are used to evacuate the whole electron beam chamber 56. Obviously, one or two vacuum pumps could be used instead since all of the evacuated spaces are connected (at least while valve 68 is open).

A first source 76 of carbonaceous vapor 78 communicates with the upper chamber 60 via a valve 80. A second source 82 of carbonaceous vapor 84 communicates with the lower chamber 62 via a valve 86. A heating element 88 and reflector 90 are positioned to apply heat to the membrane 50.

Double sided lithography is carried out with the apparatus shown in FIG. 4 in the following manner. First, the upper and lower chambers are evacuated. Optionally, heat may be applied to the membrane to drive off contaminants. Then, carbonaceous vapor is supplied to one side of the membrane. FIG. 4 shows vapor being supplied to the upper chamber only. Valve 68 may be closed if pressure equalization is not needed. If the vacuum pumps are operating, it is expected that valve 68 would need to be open for pressure equalization. In any event, vapor is not supplied to the other side of the membrane or permitted to reach the other side. As vapor is supplied to one side of the membrane, electron beam 58 writes a first pattern. Anywhere that the electron beam strikes the membrane, carbonaceous material deposits from the vapor to form what has become known as a contamination resist pattern. Since the membrane 50 is very thin, the electron beam passes through the membrane with only minimal scattering. A contamination resist pattern does not form on the other side of the membrane because no vapor is present on the other side.

After the first contamination resist pattern is completed, the precedure is repeated with respect to the other side of the membrane to form another contamination resist pattern. The vapor on the side where the first contamination resist pattern was formed is removed. This may be done in part with the vacuum pump system assisted by some membrane heating. It is also possible to merely turn off the vapor supply using the associated valve and then to deplete the residual vapor by directing the electron beam to an unused region of the membrane for a time sufficient to use up or deposit all of the vapor on that side. After the vapor has been removed from the one side where pattern writing was first done and vapor is supplied to the other side, a second pattern is written by the electron beam. This time the carbonaceous material deposits on the other side and not on the first side to selectively form a second contamination resist pattern only on the other side.

FIGS. 5.1–5.4 show a membrane in cross section at various points in this process. In these detailed illustrations, the membrane 50 has been coated on the top side with a layer 92 and on the bottom side with a layer 94 in preparation for later etching similar to what was described in connection with FIGS. 1.1–1.4. A first contamination resist pattern 96 is deposited only on the top side by supplying vapor only to the top side during irradiation with a first electron beam pattern (FIG. 5.1). Then, a second contamination resist pattern 98 is deposited only on the bottom side by supplying vapor only to the bottom side during irradiation with a second electron beam pattern (FIG. 5.2). Next, both sides are etched so that layers 92, 94 are removed everywhere except those regions protected by contamination resist (FIG. 5.3). If practical techniques are developed for removing contamination resist, it can be removed then, if desired, to produce the structure shown in FIG. 5.4.

It should be noted that there is complete freedom in defining top and bottom patterns independently of each other (they need not be identical or complementary) and no intermediate realignment of the membrane is needed because the membrane has not been removed from the vacuum chamber between the first and second pattern defining steps. Obviously, similar or identical contamination resist patterns (as viewed from the same side) can be written simultaneously, if desired, by supplying vapor to both sides simultaneously. This is illustrated in FIG. 6.1. The resulting final microcircuit structure (after removing the contamination resist) is illustrated in FIG. 6.2.

Certain modifications to the illustrated embodiments should be apparent and may be made without departing from the spirit and scope of the present invention. For example, the character of the source radiation could be different during exposure of the two sides. In addition to a difference related to an energy characteristic produced either through the use of a filter or by varying an energy controlling parameter of the source itself, it is possible in theory to use different types of radiation for exposing the two sides. For example, contamination resist could be deposited on one side with an electron beam and a resist pattern could be optically exposed on the other side. Also, one or both of the microcircuit patterns may be formed from a resist pattern by using a lift-off process rather than a subtractive etching process. When a lift-off process is used, the layer next to the supporting film or membrane is a resist layer rather than a microcircuit layer. After a relief pattern is formed in the resist layer, a microcircuit layer is deposited on top of the resist pattern and the resist pattern is dissolved away to "lift-off" the parts of the microcircuit layer which lie on top of the resist. The resist layer thus produces a complementary pattern in the microcircuit layer. Other variations or modifications should also be apparent in which double sided lithography can be performed without any intermediate realignment of the lithography workpiece between the top and bottom pattern defining steps. The general method is illustrated in block diagram in FIG. 7 and defined with more precision in the appended claims.

Having thus described our invention, what we claim as new, and desire to secure by Letters Patent is:

1. In a method of forming a microcircuit structure, the steps comprising:
defining a desired first microcircuit pattern on one side of a thin film substrate with patterned radiation incident upon said one side, and
defining a desired second microcircuit pattern on the opposite side of said thin film substrate with patterned radiation incident also upon said one side but which passes through said thin film substrate to define said second microcircuit pattern on said opposite side,
said microcircuit patterns both being defined while said thin film substrate is continuously in one alignment position.

2. The method defined in claim 1 wherein said patterned radiation defining said first microcircuit pattern and said radiation defining said patterned second microcircuit pattern are simultaneously incident upon said thin film one side.

3. The method defined in claim 1 wherein said patterned radiation defining said first microcircuit pattern and said patterned radiation defining said second microcircuit pattern comprise the same patterned radiation.

4. The method defined in claim 1 wherein said patterned radiation defining said first microcircuit pattern and said patterned radiation defining said second microcircuit pattern consist of the same patterned radiation.

5. The method defined in claim 1 wherein said first and second microcircuit patterns are substantially identical.

6. The method defined in claim 1 wherein said first and second microcircuit patterns are substantially complementary.

7. The method defined in claim 1 wherein said patterned radiation defining said desired first microcircuit pattern forms a first radiation pattern and wherein said patterned radiation defining said desired second microcircuit pattern forms a second radiation pattern said first and second radiation patterns not necessarily being different patterns.

8. The method defined in claim 7 wherein said first and second radiation patterns are substantially identical and said first and second microcircuit patterns are substantially identical.

9. The method defined in claim 7 wherein said first and second radiation patterns are substantially identical and said first and second microcircuit patterns are substantially complementary.

10. The method defined in claim 7 wherein a first resist layer is deposited on said one side of said thin film and a second resist layer is deposited on said opposite side of said thin film.

11. The method defined in claim 10 wherein said first resist layer is patterned by the radiation of said first radiation pattern to define said first microcircuit pattern and said second resist layer is patterned by the radiation of said second radiation pattern to define said second microcircuit pattern.

12. The method defined in claim 11 wherein said first and second radiation patterns are synonomous and consist of the same radiation.

13. The method defined in claim 11 wherein said radiation of said first radiation pattern does not pattern said second resist layer and said radiation of said second radiation pattern does not pattern said first resist layer.

14. The method defined in claim 13 wherein the patterned radiation defining said first microcircuit pattern and the patterned radiation defining said second microcircuit pattern have a different energy characteristic.

15. The method defined in claim 14 wherein said different energy characteristic is obtained by interposing a filter between a radiation source and said thin film.

16. The method defined in claim 14 wherein said different energy characteristic is obtained by controlling a radiation source so as to cause said source to emit radiation having a different energy characteristic.

17. The method defined in claim 11 wherein either said first or second resist layer is a positive acting resist while the other of said first or second resist layers is a negative acting resist.

18. The method defined in claim 7 wherein at least one of said first or second radiation patterns is forming through use of a pattern forming mask.

19. The method defined in claim 7 wherein at least one of said first or second radiation patterns is formed by writing with a fine beam of radiation.

20. The method defined in claim 7 wherein at least one of said radiation patterns comprises electron beam radiation.

21. The method defined in claim 7 wherein at least one of said radiation patterns comprises ion beam radiation.

22. The method defined in claim 7 wherein at least one of said radiation patterns comprises light beam radiation.

23. The method defined in claim 22 wherein said light beam radiation comprises ultra violet light radiation.

24. The method defined in claim 22 wherein said light beam radiation comprises x-ray radiation.

25. The method defined in claim 7 wherein one of said microcircuit patterns comprises contamination resist, the radiation pattern defining said one microcircuit pattern being a pattern of electron beam radiation.

26. The method defined in claim 7 wherein said first and second microcircuit patterns both comprise contamination resist, said first and second radiation patterns both being patterns of electron beam radiation.

27. The method defined in claim 26 wherein said first microcircuit pattern is formed by establishing a suitable atmosphere for deposition of contamination resist on said one side of said thin film during irradiation of said one side with said first radiation pattern of electron beam radiation.

28. The method defined in claim 27 wherein said second microcircuit pattern is simultaneously formed on said opposite side of said thin film by establishing a suitable atmosphere for deposition of contamination resist also on said opposite side of said thin film, said second radiation pattern being synonomous with and consisting of said first radiation pattern.

29. The method defined in claim 27 wherein the atmosphere on said opposite side is controlled so as to be unsuitable for deposition of contamination resist during irradiation with said first radiation pattern, said first radiation pattern of electron beam radiation thereby producing no contamination resist pattern on said opposite side of said thin film, and wherein said second microcircuit pattern is formed by establishing a suitable atmosphere for deposition of contamination resist on said opposite side of said thin film, but not on said one side, during irradiation of said one side with said second radiation pattern of electron beam radiation, said second radiation pattern passing through said thin film and causing deposition of contamination resist only on said opposite side.

* * * * *